US 8,947,896 B2

(12) United States Patent
Dunipace

(10) Patent No.: US 8,947,896 B2
(45) Date of Patent: *Feb. 3, 2015

(54) PROPORTIONAL BIAS SWITCH DRIVER CIRCUIT

(75) Inventor: Richard Alan Dunipace, Highland Village, TX (US)

(73) Assignee: Fairchild Semiconductor Corporation, San Jose, CA (US)

( * ) Notice: Subject to any disclaimer, the term of this patent is extended or adjusted under 35 U.S.C. 154(b) by 327 days.

This patent is subject to a terminal disclaimer.

(21) Appl. No.: 13/271,185

(22) Filed: Oct. 11, 2011

(65) Prior Publication Data

US 2013/0088902 A1 Apr. 11, 2013

(51) Int. Cl.
*H02M 3/335* (2006.01)
*H03K 17/082* (2006.01)
*H03K 17/10* (2006.01)

(52) U.S. Cl.
CPC ........... *H03K 17/0826* (2013.01); *H02M 3/335* (2013.01); *H03K 17/107* (2013.01)
USPC .......................................................... 363/97

(58) Field of Classification Search
CPC ........................... H02M 3/335; H03K 17/0826
USPC ........................................ 363/16–20, 97, 131
See application file for complete search history.

(56) References Cited

U.S. PATENT DOCUMENTS

| | | | |
|---|---|---|---|
| 4,132,925 A | | 1/1979 | Schmutzer et al. |
| 4,187,458 A | | 2/1980 | Milberger et al. |
| 4,586,004 A | | 4/1986 | Valdez |
| 4,663,570 A | | 5/1987 | Luchaco et al. |
| 4,680,534 A | | 7/1987 | Tanaka et al. |
| 4,709,321 A | * | 11/1987 | Trantham .................... 363/56.09 |
| 4,763,061 A | * | 8/1988 | Schwarz ........................ 320/140 |
| 4,808,853 A | | 2/1989 | Taylor |
| 5,418,702 A | * | 5/1995 | Marinus et al. ................. 363/16 |
| 5,469,029 A | * | 11/1995 | Jackson et al. ................ 315/408 |
| 6,430,071 B1 | | 8/2002 | Haneda |
| 2013/0044527 A1 | | 2/2013 | Vracar et al. |

OTHER PUBLICATIONS

STMicroelectronics "STESB01 Datasheet," dated Oct. 2006 (14 pages).
Office Action dated Jul. 8, 2013 issued in U.S. Appl. No. 13/336,136, 13 pages.

* cited by examiner

*Primary Examiner* — Adolf Berhane
*Assistant Examiner* — Yemane Mehari
(74) *Attorney, Agent, or Firm* — Grossman Tucker Perreault & Pfleger PLLC

(57) ABSTRACT

A switch bias system is provided that includes a bipolar junction transistor (BJT) switch comprising a base, emitter, and collector; a current sense circuit coupled to the emitter, the current sense circuit configured to sense current flow through the emitter of the BJT switch; and a proportional bias circuit configured to generate a bias current to the base of the BJT switch, the bias current set to a fixed proportion of the sensed current flow through the emitter of the BJT switch.

20 Claims, 5 Drawing Sheets

US 8,947,896 B2

PROPORTIONAL BIAS SWITCH DRIVER CIRCUIT

FIELD

The present disclosure relates to switch driver circuits, and more particularly, to proportional bias switch driver circuits.

BACKGROUND

Switched mode power supplies (SMPS), such as buck converters, boost converters, buck-boost converters and flyback converters perform alternating current (AC) to direct current (DC) conversions as well as DC to DC conversions with voltage level transformations from input to output. These types of power supply converters generally employ switching devices such as bipolar junction transistors (BJTs) or metal oxide semiconductor field effect transistors (MOSFETs) where the switching frequencies and pulse widths are modulated to control operational parameters of the converter such as the voltage gain or attenuation.

The use of BJTs instead of MOSFETs in the converter design can result in reduced cost and increased efficiency in higher voltage applications, for example greater than 700 volts. BJTs, however, have slower switching speeds than MOSFETs and therefore cannot operate in the higher frequency ranges that are required for some applications. BJTs also require greater control over the gate drive biasing to reduce switching losses, saturation losses and storage time, which can be difficult to achieve.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides circuits, systems and methods for supplying a proportional bias current to a BJT switch in an SMPS driver circuit, the bias being proportional to the current flowing through the BJT switch. Providing a fixed proportional bias current to the BJT switch may improve saturation, reduce storage time and increase efficiency of the BJT switch. Additionally a method is provided to increase the switching speed of the SMPS driver beyond the rate that is generally achievable with a BJT switch by employing an additional MOSFET switch in series with the BJT switch while maintaining the higher voltage handling capabilities of the BJT switch for the SMPS driver circuit.

Figure 1:
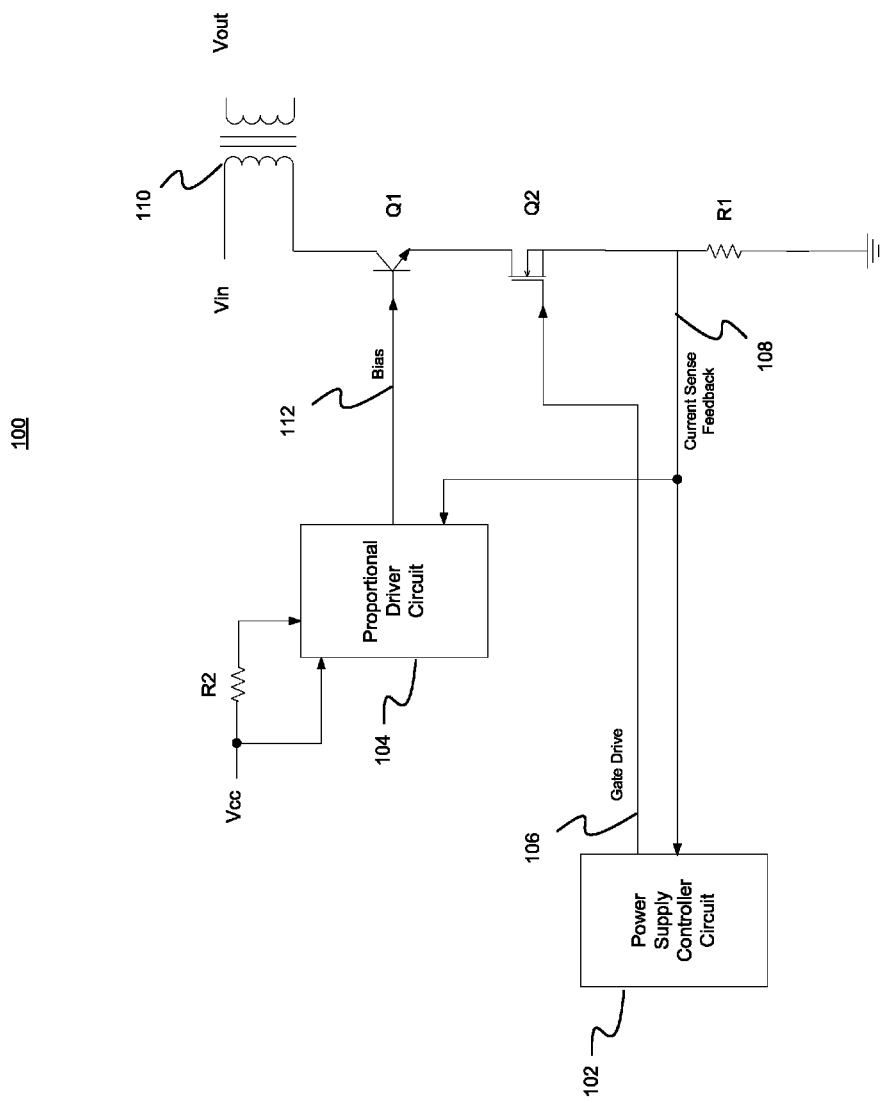
FIG. 1 illustrates a system block diagram of one exemplary embodiment consistent with the present disclosure.

FIG. 1 illustrates a system block diagram 100 of one exemplary embodiment consistent with the present disclosure. Proportional driver circuit 104 is shown as a component in a switched mode power supply configured as a flyback converter, although other types of AC-DC or DC-DC converters maybe used. These types of converters include a switch, e.g. a transistor Q1/Q2, which is selectively operated to allow energy to be stored in an energy storage device, e.g. an inductor or transformer winding 110, and then transferred to one or more output capacitors (not shown in FIG. 1) that smooth the DC output voltage Vout to the load and provide essentially continuous energy to the load between energy storage cycles.

The collector of switch Q1, a BJT transistor, is coupled to one side of the transformer primary 110, and the input voltage Vin is coupled to the other side of transformer primary 110. The emitter of switch Q1 is coupled to the drain of MOSFET switch Q2 such that switches Q1 and Q2 are in series. The series combination of BJT switch Q1 and MOSFET switch Q2 in this configuration may be referred to as an emitter switched BJT/MOSFET Cascode, and also referred to herein as an ESBC™ switch (ESBC™ is a trademark of Fairchild Semiconductor Corp.). A cascode is a two stage amplifier which is configured to improve input/output isolation, frequency of operation, and overall improved performance. The source of MOSFET switch Q2 is coupled to current sense resistor R1 which in turn is coupled to ground. In some embodiments, the ESBC™ switch may include a low voltage, high performance MOSFET in series with a high-voltage BJT. Of course, other transistor technologies may be used, for example, SiC (silicon on carbide), etc.

BJT switch Q1 may be configured to handle relatively large voltage drops between collector and emitter. In some embodiments this Q1 voltage may exceed 700 volts. MOSFET switch Q2, however, may be configured to handle relatively smaller voltage drops between drain and source. In some embodiments this Q2 voltage may be in the range of 20 to 40 volts. The ESBC™ switch may therefore be used advantageously in higher voltage switching applications.

The control of the switching times for switch Q2 is provided through a gate drive signal 106 supplied by a power supply controller circuit 102. In some embodiments, power supply controller circuit 102 may be a FAN7601 controller sold by Fairchild Semiconductor Corporation. Current sense resistor R1 monitors current flow through Q1 and Q2 and provides current sense feedback 108 to power supply controller circuit 102. In response to this current sense, power supply controller circuit 102 modulates gate drive signal 106 causing switch Q2 to turn on and off which regulates the current flow through both Q1 and Q2. The modulation may be frequency modulation, pulse width modulation or any other suitable modulation type.

MOSFET switch Q2 is generally capable of higher switching rates than BJT switch Q1 so the series combination of Q1 and Q2 into an ESBC™ switch advantageously provides increased switching speeds along with increased voltage handling capability. In order for the ESBC™ switch to operate efficiently, however, the bias for switch Q1 must be dynamically controlled in response to changing load conditions. Proportional driver circuit 104 provides this function by monitoring current sense feedback 108 and adjusting the bias signal 112 to switch Q1 such that the bias signal is maintained as a fixed proportion of the current flow through Q1. The fixed proportion can be set based on a ratio of the resistance values of R1 and R2. By choosing the proper ratios for the fixed proportion biasing, which depend on operational parameters of the switch Q1, performance of the switch can be optimized by reducing storage time, switching losses and saturation losses and increasing efficiency.

Figure 2:
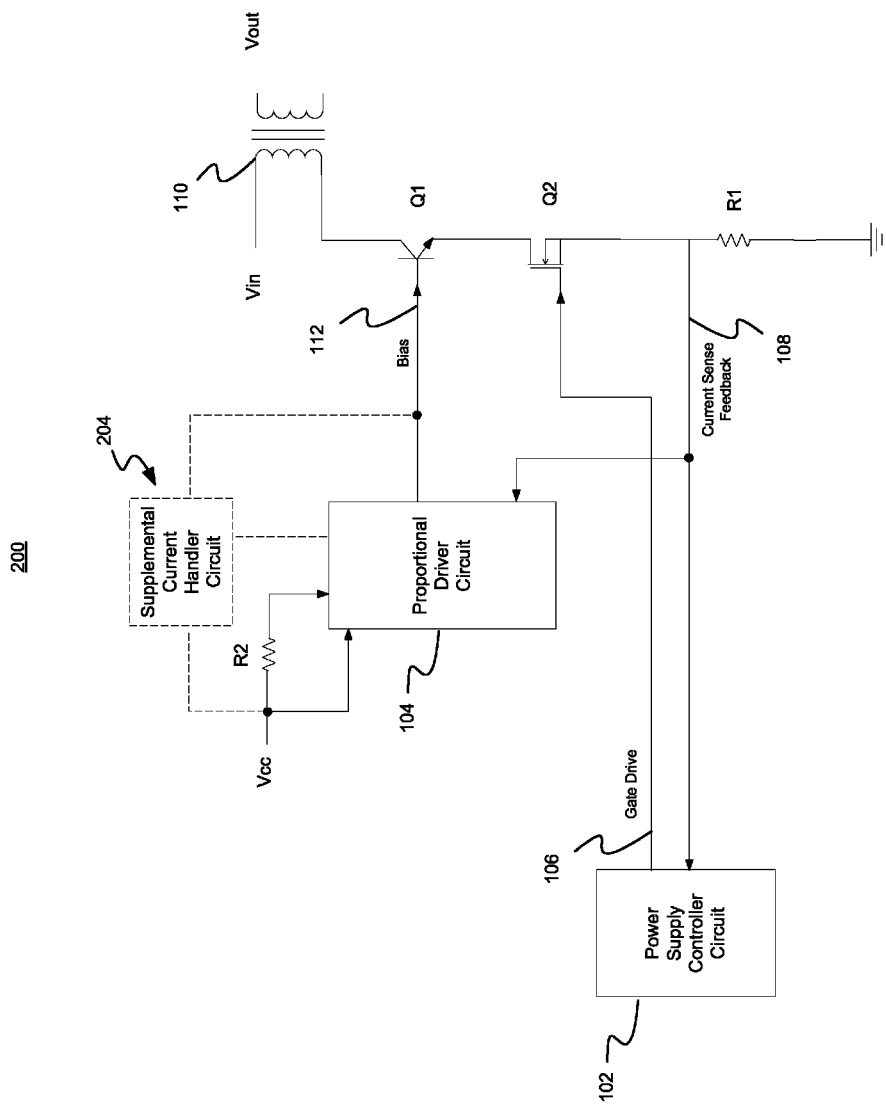
FIG. 2 illustrates a system block diagram of another exemplary embodiment consistent with the present disclosure.

FIG. 2 illustrates a system block diagram 200 of another exemplary embodiment consistent with the present disclosure. FIG. 2 shows the system 100 from FIG. 1 with the addition of an optional supplemental current handler circuit 204. The supplemental current handler circuit 204 provides one or more additional switched current flow paths that add to the current handling capability and may limit the power dissipation in the proportional driver circuit 104, as will be explained in greater detail below.

Figure 3:
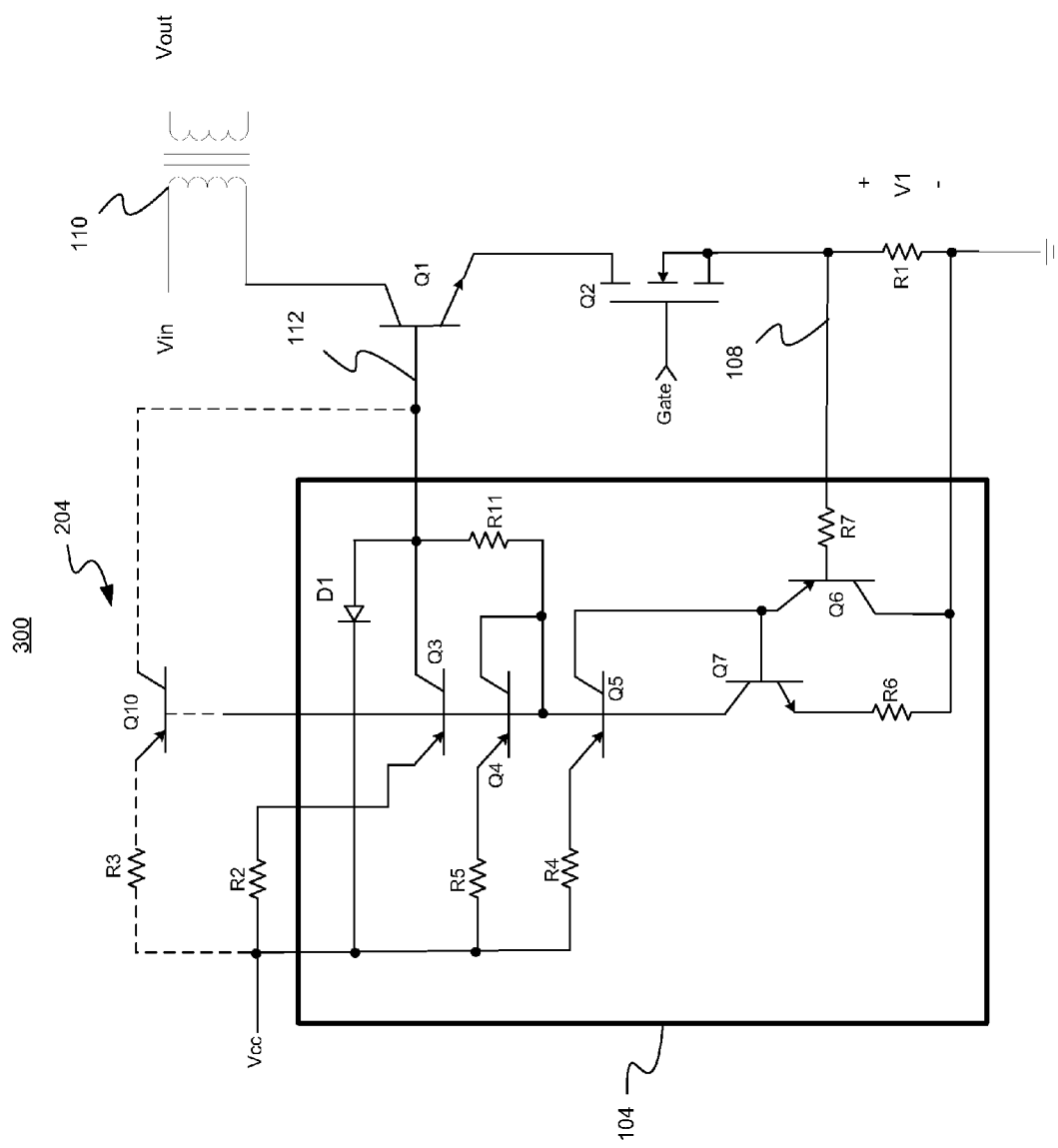
FIG. 3 illustrates a circuit diagram of one exemplary embodiment consistent with the present disclosure.

FIG. 3 illustrates a circuit diagram 300 of one exemplary embodiment consistent with the present disclosure. Proportional driver circuit 104 is illustrated in greater detail and includes transistors Q3, Q4, Q5, Q6, Q7, resistors R4, R5, R6, R7, R11 and diode D1. By eliminating the need for a transformer, proportional driver circuit 104 may be included with, or form part of, a general-purpose or custom integrated circuit (IC) such as a semiconductor integrated circuit chip, system on chip (SoC), etc. While the present embodiment uses BJTs and/or MOSFETs, any combination of BJTs and MOSFETs may be used to realize this function.

Initially, as the system turns on, there is no current flowing through Q1, Q2 or the transformer primary 110. When the gate of Q2, which is driven by power supply controller 102, goes positive, Q2 turns on and allows current to flow from the transformer primary 110 through the emitter of Q1 and through the current sense resistor R1 and then to ground. As Q2 turns on, it lowers the voltage on the emitter of Q1, forward biases the base-emitter of Q1, which may be approximately 0.6 volts, and lowers the voltage on the base of Q1 in turn. Initially, resistor R11 provides a small bias current from the biasing supply (Vcc) (through R5 and Q4) to the base of Q1 so that Q1 may begin to conduct. The current through R11 also provides bias current through R4 and Q5 to turn on Q6, Q7, Q3, and Q10 if employed. Diode D1 provides a return path for the turn off current from the base of Q1 during ESBC™ switch turn off.

The inductance of transformer primary 110 initially impedes current flow but as energy builds up in the coil, current flow increases. The current flow through current sense resistor R1 produces a voltage drop V1 which is proportional to that current. Voltage V1 is applied, through resistor R7 to the base of Q6. Voltage V1, plus the base to emitter voltage of Q6, which may be approximately 0.6 volts, is then applied to the base of Q7. This combined voltage at the base of Q7 is then decreased by the base to emitter voltage of Q7, which is also approximately 0.6 volts, so that the voltage across R6 is substantially equal to V1. Q5 and R4 bias Q6 and Q7 such that their base to emitter voltages are substantially the same which enables this cancellation effect.

The voltage across R6 produces a current flow through Q7, Q4 and R5. The resistance of R5 is set to approximately twice the resistance of R6 so that voltage drop across R5 is twice the voltage V1. The voltage across R5 is added to the base to emitter voltage of Q4 and applied to the base of Q5, Q4 and Q3. The voltage across R2 is substantially equal to the base voltage of Q3 minus the base to emitter voltage of Q3, thus the voltage across R2 is about twice the voltage V1. The ratio of R1 to R2 is adjusted to set the bias current for Q1. Thus, as the current through transformer primary 110 increases, the voltage across R1 increases and the bias current to Q1 increases proportionally based on the R1/R2 ratio. The voltage across R2 was doubled versus the voltage across R1 to provide added thermal stability to the Q1 bias current. Of course, other R1/R2 ratios may be used, for example, using a higher voltage on V2 may operate to lower the temperature dependence of the circuit and improve stability.

In some embodiments, a current handler circuit 204 may be included. In this example, the current handling circuit 204 includes transistor Q10 and resistor R3. If supplemental current handler circuit 204 is employed, the sum of the voltage across R5 and the base to emitter voltage of Q4 is applied to the base of Q10 causing the voltage across R3 to also be about twice the voltage V1. This allows Q10 to provide an additional switched current flow path that adds to the current flowing through Q3 and may limit the power dissipation in the proportional driver circuit 104. Of course, while a single stage current handler circuit 204 is shown, it is to be understood that addition, similar stages may be used to provide additional current reduction through Q3.

The proportional driver circuit 104 may draw power from the Vcc supply only when the ESBC™ switch is on, which decreases the power consumption and increases the efficiency of the circuit.

Figure 4:
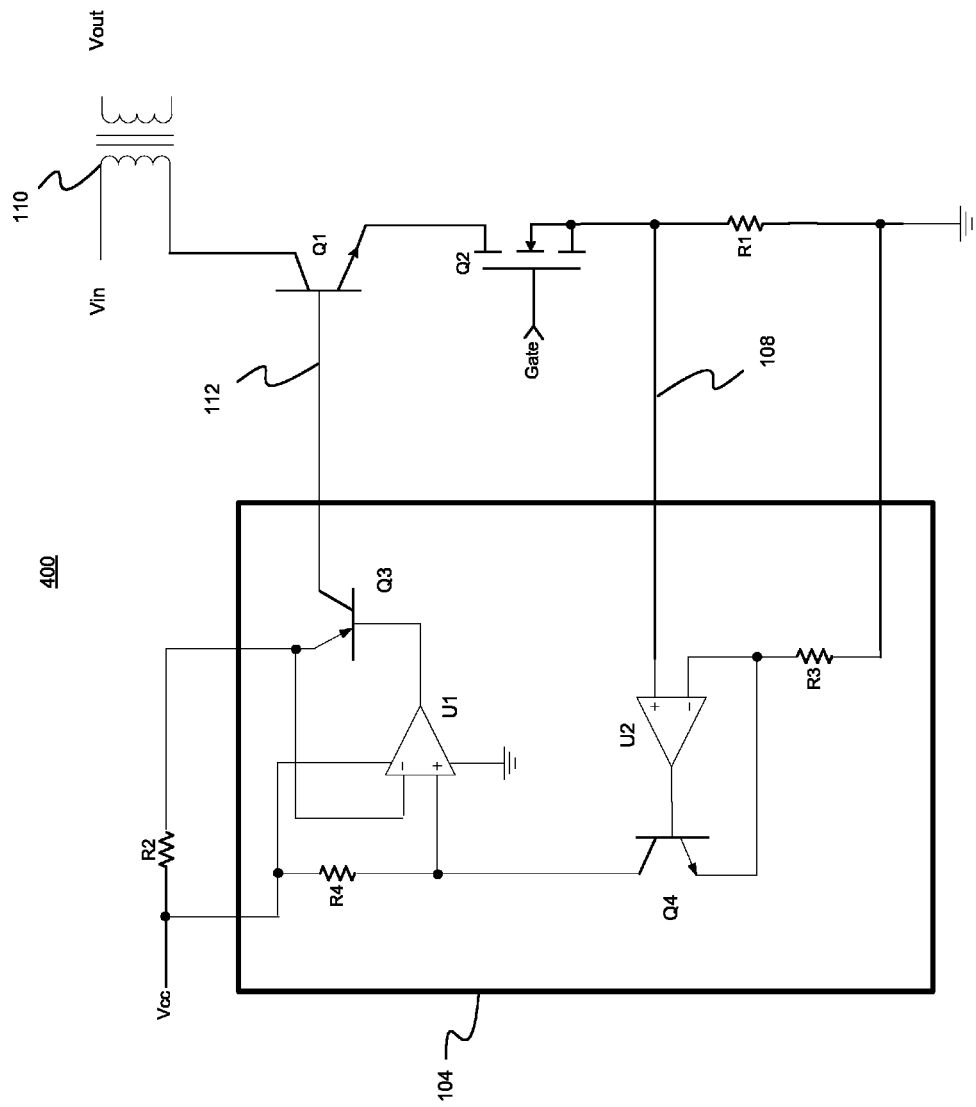
FIG. 4 illustrates a circuit diagram of another exemplary embodiment consistent with the present disclosure.

FIG. 4 illustrates a circuit diagram 400 of another exemplary embodiment consistent with the present disclosure. An alternative embodiment of proportional driver circuit 104 is illustrated which includes transistors Q3, Q4, resistors R3, R4 and operational amplifiers (op-amps) U1, U2.

Initially, as the system turns on, there is no current flowing through Q1, Q2 or the transformer primary 110. When the gate of Q2, which is driven by power supply controller 102, goes positive, Q2 turns on and allows current to flow from the transformer primary 110 through the emitter of Q1 and through the current sense resistor R1 and then to ground. The inductance of transformer primary 110 initially impedes current flow but as energy builds up in the coil, current flow increases. The current flow through current sense resistor R1 produces a voltage drop V1 which is proportional to that current.

Voltage V1 is applied to the positive input of op-amp U2 and if V1 is more positive than the voltage on the negative input of op-amp U2, the op-amp output is driven high. The high output of U2 turns on transistor Q4 until the voltage on the positive input to U2 substantially equals the voltage on the negative input of U2. Once that occurs, the voltage across R1 is substantially equal to the voltage across R3. The current through R3 is set by the ratio of the resistance of R1 to R3. The current through R3 also then flows through Q4 and R4. If R3 and R4 have the same resistance then they will have substantially the same voltage drop across them.

If the positive input of op-amp U1 is more negative than the negative input of op-amp U1, the op-amp output is driven low turning on transistor Q3. Q3 will continue to increase in conduction until the positive and negative inputs of op-amp U1 reach approximately the same voltage, at which point the voltage across R2 will be substantially the same as the voltage across R4.

The bias current to Q1 can be set by selecting the ratios of R1 to R3 and R4 to R2. The bias current to Q1 is therefore maintained at a fixed proportion of the current through Q1. The gate drive from the controller also turns on the op-amps U1 and U2. When the gate drive goes high, the op-amps turn on. This is done to minimize the driver bias current when the proportional driver is off. This improves efficiency and aids controller start up when input voltage is first applied to the power supply. The transistors Q3, Q4 plus the op-amps may be realized with any combination of BJTs or MOSFETs.

Figure 5:
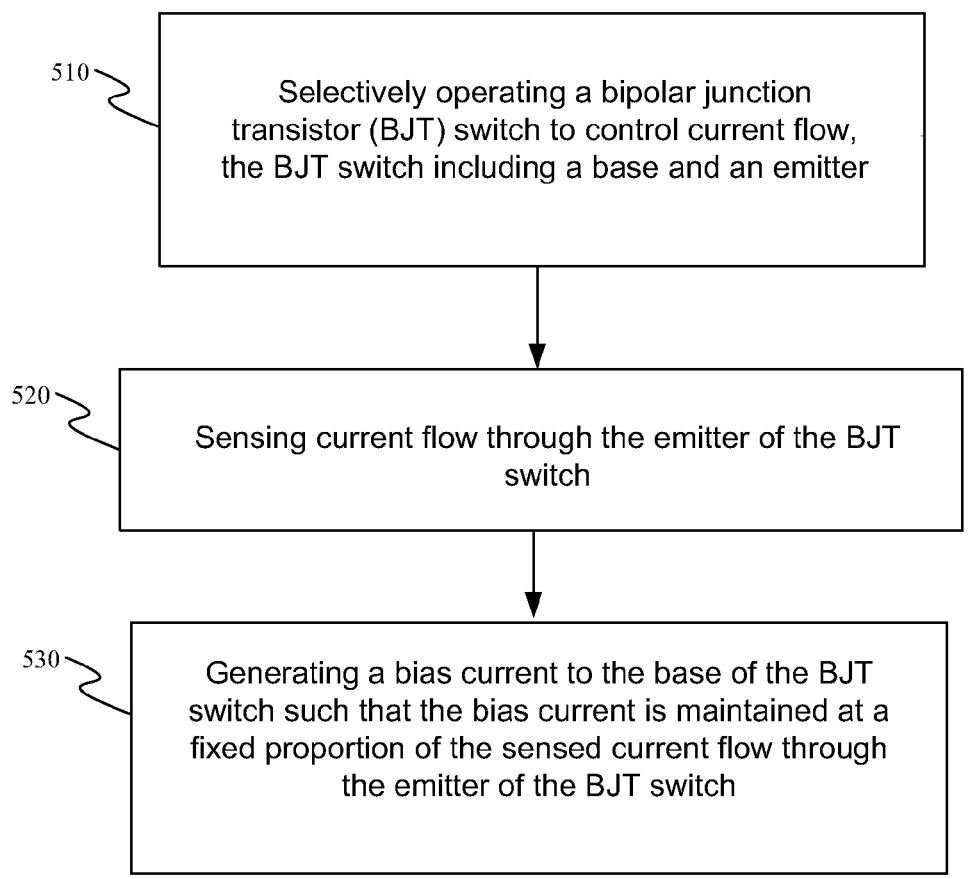
FIG. 5 illustrates a flowchart of operations of one exemplary embodiment consistent with the present disclosure.

FIG. 5 illustrates a flowchart of operations 500 of one exemplary embodiment consistent with the present disclosure. At operation 510, a BJT switch is selectively operated to control current flow. The BJT switch includes a base, an emitter, and a collector. At operation 520, current flow through the emitter of the BJT switch is sensed. At operation 530, a bias current is generated to the base of the BJT switch. The generated bias current is maintained at a fixed proportion of the sensed current flow though the emitter of the BJT switch.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

In still other embodiments, the proportional driver circuit may be realized using digital and/or mixed signal topologies. For example, an A/D (an analog to digital) converter might be used to convert the current sense voltage V1 to a digital number. This digital number could then be used to produce a digitally derived bias current. Stacked switches may be used which may be digitally weighted as to bias value. For example, four switches would provide 16 possible drive levels. An A/D converter may be used to convert the sensed current into a digital value, and in some embodiments, additional signal processing may be employed.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A system, comprising:
    a bipolar junction transistor (BJT) switch comprising a base, emitter, and collector;
    an energy storage circuit coupled to said collector of said BJT, said energy storage circuit supplying current flow to said collector of said BJT;
    a current sense circuit coupled to said emitter, said current sense circuit configured to sense current flow through said emitter of said BJT switch; and
    a proportional bias circuit configured to generate a bias current to said base of said BJT switch, said bias current set to a fixed proportion of said sensed current flow through said emitter of said BJT switch.

2. The system of claim 1, further comprising a metal oxide semiconductor field effect transistor (MOSFET) switch coupled in series between said emitter of said BJT switch and said current sense circuit, said MOSFET switch configured to switch current flow through said emitter of said BJT switch.

3. The system of claim 1, wherein said current sense circuit comprises a current sense resistor and said proportional bias circuit is coupled to a supply voltage through a supply voltage resistor and said fixed proportion is based on a ratio of the resistance of said current sense resistor to the resistance of said supply voltage resistor.

4. The system of claim 1, wherein said system provides a bias to a switch associated with a switched mode power supply.

5. The system of claim 1, wherein said energy storage circuit is one of an inductor or a winding of a transformer.

6. The system of claim 1, wherein said BJT is operable at voltages greater than 700 volts.

7. The system of claim 2, wherein said switching of said MOSFET is controlled by a pulse width modulation (PWM) signal provided by a power supply controller circuit.

8. A method, comprising:
    selectively operating a BJT switch to control current flow, said BJT switch comprising a base, emitter, and collector;
    coupling a current sense circuit to said emitter of said BJT directly, or through a series MOSFET, said current sense circuit configured to sense current flow through said emitter of said BJT switch; and
    generating a bias current to said base of said BJT switch, said bias current maintained at a fixed proportion of said sensed current flow through said emitter of said BJT switch.

9. The method of claim 8, further comprising coupling a MOSFET switch in series between said emitter of said BJT switch and said current sense circuit, said MOSFET switch configured to switch current flow through said emitter of said BJT switch.

10. The method of claim 8, further comprising determining said fixed proportion based on a ratio of the resistance of a current sense resistor to a supply voltage resistor, wherein said current sense resistor is associated with said current sense circuit and said supply voltage resistor is associated with a supply voltage coupled to a proportional bias circuit, said proportional bias circuit generating said bias current.

11. The method of claim 8, wherein said bias current is supplied to a switch associated with a switched mode power supply.

12. The method of claim 8, wherein said BJT is operable at voltages greater than 700 volts.

13. The method of claim 8, further comprising operating said BJT at voltages greater than 700 volts.

14. The method of claim 9, wherein said switching of said MOSFET is controlled by a pulse width modulation (PWM) signal provided by a power supply controller circuit.

15. An apparatus, comprising:
- a bipolar junction transistor (BJT) switch comprising a base, emitter, and collector;
- a current sense circuit coupled to said emitter, said current sense circuit configured to sense current flow through said emitter of said BJT switch; and
- a proportional bias circuit configured to generate a bias current to said base of said BJT switch, said bias current set to a fixed proportion of said sensed current flow through said emitter of said BJT switch.

16. The apparatus of claim 15, further comprising a metal oxide semiconductor field effect transistor (MOSFET) switch coupled in series between said emitter of said BJT switch and said current sense circuit, said MOSFET switch configured to switch current flow through said emitter of said BJT switch.

17. The apparatus of claim 15, wherein said current sense circuit comprises a current sense resistor and said proportional bias circuit is coupled to a supply voltage through a supply voltage resistor and said fixed proportion is based on a ratio of the resistance of said current sense resistor to the resistance of said supply voltage resistor.

18. The apparatus of claim 15, wherein said system provides a bias to a switch associated with a switched mode power supply.

19. The apparatus of claim 15, wherein said BJT is operable at voltages greater than 700 volts.

20. The apparatus of claim 16, wherein said switching of said MOSFET is controlled by a pulse width modulation (PWM) signal provided by a power supply controller circuit.

* * * * *